United States Patent [19]

Hsiao et al.

[11] Patent Number: 5,292,688

[45] Date of Patent: *Mar. 8, 1994

[54] SOLDER INTERCONNECTION STRUCTURE ON ORGANIC SUBSTRATES AND PROCESS FOR MAKING

[75] Inventors: Richard Hsiao, Vestal; Jack M. McCreary, Apalachin; Voya R. Markovich, Endwell; Donald P. Seraphim, Vestal, all of N.Y.

[73] Assignee: International Business Machines Corporation, Armonk, N.Y.

[*] Notice: The portion of the term of this patent subsequent to Feb. 18, 2009 has been disclaimed.

[21] Appl. No.: 890,798

[22] Filed: Jun. 1, 1992

Related U.S. Application Data

[63] Continuation of Ser. No. 493,125, Mar. 14, 1990, Pat. No. 5,121,190.

[51] Int. Cl.$^5$ .............................. H01L 21/20
[52] U.S. Cl. ................... 437/209; 437/211; 437/212; 437/213
[58] Field of Search ............ 437/209, 211, 212, 183, 437/213

[56] References Cited

U.S. PATENT DOCUMENTS 5,089,440 2/1992 Christie et al. ..................... 437/211

FOREIGN PATENT DOCUMENTS 0340492 11/1989 European Pat. Off. .

OTHER PUBLICATIONS

Japan, Patent Abstracts, vol. 9, No. 28 (C-264) 6 Feb. 1985 & JP-A-59 172 516 (Toshiba KK).
Japan, Patent Abstracts, vol. 13, No. 169 (C-587) 21 Apr. 1989 & JP-A-63 317 545 (Matsushita Electric Works Ltd.).
World Patents Index (Latest), Accession No. 87,011132, week 2, Derwent Publications Ltd., Longon GB & JP-A-61 269 342 (Hitachi KK), Nov. 28, 1986.
Japan, Patent Abstracts, vol. 5, No. 200 (C-84) 18 Dec. 1981 & JP-A-56 122 824 (Toshiba Corp.).
World Patents Index (Latest), Accession No. 82-09110E, Week 05, Derwent Publications Ltd., London GB & JP-A-56166259 (Mitsubishi) Dec. 21, 1981.
Chemical Abstracts, vol. 89, 1978, Columbus, Ohio, US; Abstract No. 111490S, Miyadera: "Epoxy Resin Curing Compositions" p. 88.
Japan, Patent Abstracts, vol. 13, No. 339 (C-624) 31 Jul. 1989 & JP-A-01 118 563 (Toshiba Chem. Corp.).
Japan, Patent Abstracts, vol. 13, No. 579 (C-668) 20 Dec. 1989 & JP-A-01 242 655 (Toshiba Corp.).
Japan, Patent Abstracts, vol. 9, No. 244 (E-346) 30 Sep. 1985 & JP-A-60 094 744 (Nippon Denso KK).
Japan, Patent Abstracts, vol. 9, No. 197 (E-335) 14 Aug. 1985 & JP-A-60 063 951 (Hitachi Seisakusho K.K.).

*Primary Examiner*—Brian E. Hearn
*Assistant Examiner*—Trung Dang
*Attorney, Agent, or Firm*—Pollock, Vande Sande & Priddy

[57] ABSTRACT

Solder interconnection whereby the gap created by solder connections between an organic substrate and semiconductor device is filled with a composition obtained from curing a thermosetting preparation containing a thermosetting binder; and filler having a maximum particle size of 50 microns.

7 Claims, 1 Drawing Sheet

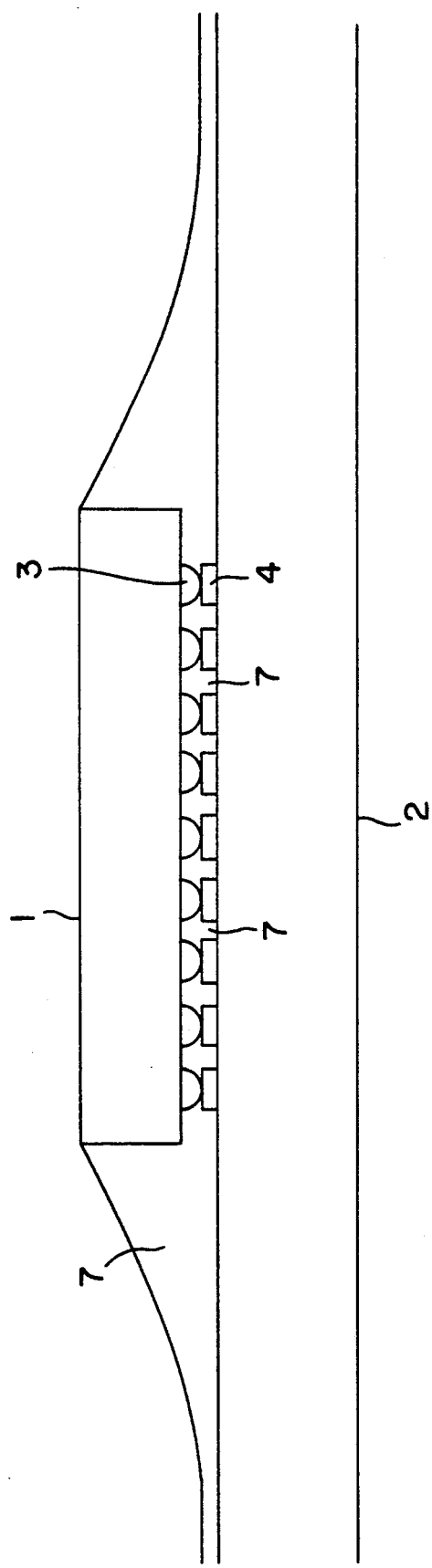

SOLDER INTERCONNECTION STRUCTURE ON ORGANIC SUBSTRATES AND PROCESS FOR MAKING

CROSS REFERENCE TO RELATED APPLICATIONS

This is a divisional application of copending application Ser. No. 07/493,125 filed Mar. 14, 1990, which is now U.S. Pat. No. 5,121,190.

TECHNICAL FIELD

The present invention is concerned with interconnection structures for joining an integrated semiconductor device to an organic substrate and particularly to a structure for forming solder interconnection joints that exhibit improved fatigue life and stability. The present invention is especially concerned with so-called "controlled collapse chip connection" or "C4" that employs solder-bump interconnections. Such is also referred to as the face down or flip-chip bonding. The present invention is also concerned with a method of making the interconnection structure.

BACKGROUND ART

Controlled collapse chip connection (C4) or flip-chip technology has been successfully used for over twenty years for interconnecting high I/O(input/output) count and area array solder bumps on the silicon chips to the base rigid ceramic chip carriers, for example alumina carriers. The solder bump, typically a 95 Pb/5 Sn alloy, provides the means of chip attachment to the rigid ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a rigid ceramic carrier. Typically, a malleable pad of metallic solder is formed on the semiconductor device contact site and solder joinable sites are formed on the conductors on the rigid chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the rigid carrier.

Usually the integrated circuit semiconductor devices are mounted on rigid supporting substrates made of materials with coefficients of expansion that differ from the coefficient of expansion of the material of the semiconductor device, i.e. silicon. Normally the device is formed of monocrystalline silicon with a coefficient of expansion of $2.5 \times 10^{-6}$ per °C. and the substrate is formed of a ceramic material, typically alumina with a coefficient of expansion of $5.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

More recently, an improved solder interconnection structure with increased fatigue life has been disclosed in U.S. Pat. No. 4,604,644 to Beckham, et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the rigid support substrate, dielectric organic material disposed between the peripheral area of the device and the facing area of the substrate, which material surrounds at least one outer row and column of solder connections but leaves the solder connections in the central area of the device free of dielectric organic material.

The preferred material disclosed in U.S. Pat. No. 4,604,644 is obtained form a polyimide resin available commercially and sold under the trademark AI-10 by Amoco Corporation. AI-10 is formed by reacting a diamine such as p,p'diaminodiphenylmethane with trimellitic anhydride or acylchloride of trimellitic anhydride. The polymer is further reacted with gamma-amino propyl triethoxy silane (A1100) or β-(3,4-epoxy cyclohexyl) ethyltrimethoxy silane (A-186). The coating material is described in IBM TDB Sept. 1970 P. 825.

The dielectric material is typically applied by first mixing it with a suitable solvent and then dispensing it along the periphery of the device where it can be drawn in between the device and substrate by capillary action.

Although the above techniques have been quite successful for attachments to rigid ceramic substrates, the attachment of a semiconductor device to inorganic substrate employing a C4 type connection are not suggested in the prior art. This is probably due to the fact that organic substrates present significant additional problems not experienced with employing rigid ceramic substrates. For example, the differences in the coefficients of thermal expansion of the material of the semiconductor device, i.e. silicon and organic substrates greatly exceed that experienced with ceramic substrates. In fact, coefficient of thermal expansion mismatch is so great that attempts to attach the device to an organic substrate result in destroying any solder bond. Also, due to the flexible nature of organic substrates, including those that are fiber reinforced, the substrates tend to warp or bend during processing and temperature fluctuations. This greatly magnifies the problems associated with the destructive stress forces that would be placed upon any solder joint between the substrate and semiconductor device.

Moreover, organic substrates generally cannot tolerate processing temperatures of the magnitude that can be tolerated by ceramics. However, it would be desirable to be able to directly bond semiconductor chips to an organic substrate such as a printed circuit board by employing solder bumps, and to permit larger DNP chips to be attached to said substrates while still achieving good C4 fatigue life properties.

With contemplated designs it will be difficult to create an exact balance of CTE's and exact layer symmetry to prevent bending. Although these designs will indeed be expected to be reasonably mechanically compatible, we will want to have the most optimum conditions with the lowest stress on the "C4"s. This would provide design versatility for use with a variety of chip sizes, some of which will become very large, for example, the order of 1 inch square.

It also would enable chips to be attached directly on the surface board thereby eliminating an intermediate chip carrier.

Very limited success has been achieved by including copper/Invar/copper in the interior of organic substrate board to bring the coefficient of thermal expansion closer to that of the chip. However, resistance to thermal cycling of such, although somewhat improved, is not especially satisfactory.

SUMMARY OF INVENTION

The present invention is concerned with providing C4 solder connections of an integrated semiconductor device on an organic substrate. The problem of the tendency of organic substrates to bow and twist with virtually precluded the ability to directly attach such to an integrated semiconductor device by C4 solder connections is compensated for by the present invention. The present invention prevents the C4 bonds from breaking and at least significantly minimize the bowing in the localized chip encapsulant area. The present invention also compensates for the excessive thermal mismatch between the organic substrates and the semiconductor devices.

The present invention makes it possible to achieve the desired bonding without including metal in the interior of the substrate such as the copper/Invar/copper. Accordingly, the present invention is suitable for substrates that do not include metal in the interior as well as those containing metals including the conventional copper foil as the metal therein. Of course, if desired, the more elaborate copper/Invar/copper can be used.

In particular, the present invention is concerned with solder interconnection for forming connections between an integrated semiconductor device and an organic substrate. The solder interconnection includes a plurality of solder connections that extend from the organic substrate to electrodes on the semiconductor device to form a gap between the carrier substrate and the semiconductor device. The gap is filled with a composition obtained from curing a curable composition containing a thermosetting binder and a filler. The binder employed has viscosity at normal room temperatures (25° C.) of no greater than about 1,000 centipoise. The filler has a maximum particle size of 50 microns. The binder is resistant to temperatures of at least about 280° C. The amount of binder is about 60 to about 25 percent by weight of the total of the binder and filler and, correspondingly, the filler is about 40 to about 75 percent by weight of the total of the binder and filler.

In addition, the present invention is concerned with a method of achieving solder interconnections between a semiconductor device and an organic substrate. The method includes attaching the device to the organic substrate by a plurality of solder connections that extend from the organic substrate to electrodes on the semiconductor device to form a gap between the supporting substrate and the semiconductor device. The gap is filled with the above disclosed binder-filler composition and the composition is cured.

Surprisingly, the present invention results in C4 interconnections of semiconductor device, onto organic substrates that are at least as resistant to fatigue and in certain cases significantly improved as compared to encapsulated C4 interconnections on ceramic rigid substrates. This is surprising since without the encapsulant as employed in the present invention, the solder bonds on organic substrates are completely unacceptable for thermal cycling to simulate system behavior.

SUMMARY OF DRAWINGS

FIG. 1 is a schematic diagram of a solder interconnection pursuant to the present invention.

BEST AND VARIOUS MODES FOR CARRYING OUT INVENTION

To facilitate understanding of the present invention, reference is made to the figure. In the figure, numeral 1 represents a semiconductor chip joined to the organic 2 by solder bumps 3 mated to pads 4. The encapsulant 5 pursuant to the present invention provides for essentially void free polymer encapsulation of the solder connections thereby assuring highly reliable devices and fills the gap.

The encapsulant composition required by the present invention contain a binder and a filler. Suitable binders include polyepoxides, cyanate esters and prepolymers thereof. The thermosetting binders employed in the present invention have viscosities at 25° C. of no greater than about 1,000 centipoise and most preferably about 300 to about 450 centipoise.

The compositions employed pursuant to the present invention also include a filler and especially an inorganic filler. The particle size of the filler must not be greater than 50 microns or less, preferably about not .to be greater than 35 microns and most preferably not to be greater than 25 microns. Most preferably at least about 90 weight % of the particles are no smaller than 0.7 microns. Smaller particle sizes are necessary so that the composite polymer material will readily flow in the gap between the chip and substrate carrier. The gap is normally about 25 to about 50 microns but in some cases is somewhat larger such as about 75 to about 125 microns. The preferred fillers have average particle size of about 3 to about 5 microns, even though there may be a distribution of a minor amount of some larger particles.

In addition, according to preferred aspects of the present invention, the filler is at least substantially free of alpha particle emissions such as from the trace amounts of radioactive impurities such as uranium and thorium normally present in conventional silica or quartz fillers. The preferred fillers employed have emission rates of less than 0.01 alpha particles/$cm^2$-hr and most preferably less 0.005 alpha particles/$cm^2$-hr. The presence of $\alpha$-particle emissions primarily caused by the presence of uranium and thorium isotopes in the fillers can generate electron/hole pairs which in turn would be detrimental to the device. The preferred filler is high purity fused or amorphous silica or synthetic glass commercial fillers which typically are rounded filler particles. A commercially available filler that can be employed is DP4910 from PQ Corporation. The preferred filler can be optionally treated with a coupling agent.

The compositions of the present invention contain about 25 to about 60% by weight and preferably about 50 to about 60% by weight of the binder and correspondingly about 40 to about 75% by weight and preferably about 50 to about 60% by weight of the filler. These amounts are based upon the total amounts of binder and filler in the composition. When the binder includes the polyepoxide, the compositions employed in the present invention also include a hardening or curing agent. The preferred hardeners for the polyepoxides are the anhydrides or organic carboxylic acids. The hardening agent is preferably in liquid form. If a solid hardening agent is employed, such should be melted when added to the composition. Examples of anhydrides are methyltetrahydrophthalic anhydride; hexahydrophthalic anhydride; maleic anhydride, trimellitic anhydride; pyromellitic dianhydride, tetrahydrophthalic anhydride; phthalic anhydride; norbornenedicarboxylic anhydride; nadic methyl anhydride; and methylcyclohexane-1,2-dicarboxylic anhydride.

Additional anhydrides can be found, for instance, in H. Lee and K. Neville, *Handbook of Epoxy Resin*, McGraw Hill, 1967, Chapter 12, disclosure of which is incorporated herein by reference.

The anhydride curing agent is generally employed in amounts constituting on an equivalent basis, about 20% to about 120% of the cycloaliphatic epoxide employed and more usually about 75% to about 100% of the epoxide equivalents.

Typically the curing agent is employed in amounts of about 89 to about 110 parts by weight per hundred parts of polyepoxy (phr).

In addition to the binder and filler, the compositions can also include a catalyst to promote the polymerization of the epoxy and/or cyanate ester.

Suitable catalysts for the epoxy include amines such as the tertiary amine benzyldimethylamine, 1,3-tetramethyl butane diamine, tris (dimethylaminomethyl) phenol, pyridine, and triethylenediamine and acidic catalysts such as stannous octoate.

Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper acetylacetonate or octoates or naphthenates. The amount of catalyst when used can vary, and generally will be 0.005 to 5 weight percent, preferably 0.05 to 0.5 weight percent based on total solid binder weight.

Surfactants in amounts of about 0.5% to about 3% and preferably about 1.2% to about 1.6% can be used to facilitate mixing the filler with the epoxy. Suitable surfactants include silanes and non-ionic type surface active agents.

The compositions employed in the present invention also include an organic dye in amounts less than about 0.2% to provide contrast. Suitable dyes are nigrosine and Orasol blue GN, and non-electrically conductive carbon black.

The preferred compositions employed pursuant to the present invention are substantially free (e.g.—less than 0.2% by weight) if not completely free from non-reactive organic solvents. Typically, the filler and polymer should be at least substantially free from the ionic impurities chloride, sodium and potassium (e.g.—less than 20 ppm each). Compositions employed pursuant to the present invention have viscosity at 25° C. (Brookfield cone & plate Spindle 51, 20 RPM or equivalent) of about 3,000 to about 30,000 centipoise and preferably about 3,000 to about 17,000 centipoise. The compositions are stable for at least 12 hours. The compositions can be cured at temperatures of less than about 150° C. and preferably about 130° C. to about 140° C. in about 2 to about 6 hours and preferably about 4 hours. The compositions when cured have alpha particle emissions of less than about 0.005 preferably less than about 0.004 counts/cm$^2$-hr and most preferably less than about 0.002 counts/cm$^2$-hr. The cured compositions also have coefficient of thermal expansion of about 20 to about 40 ppm/.C and preferably about 25 to about 30 ppm/°C., glass transition temperature of greater than about 130° C. and preferably about 140° to about 160° C. The cured compositions have Shore D hardness of greater than 85 and preferably greater than 90, modulus of elasticity at 25° C. of greater than 250,000 psi and preferably greater than 750,000 psi; volume resistivity at 25° C. of greater than $10^{13}$ ohm-cm and preferably greater than $10^{14}$ ohm-cm, dielectric constant at 25° C. of less than 5.0 and preferably less than 4.5.

The compositions can be prepared by rapidly admixing the components under vacuum usually about 5 mm Hg either using a double planetary mixer or high shear mixer to provide homogenous compositions.

Suitable encapsulants employed pursuant to the present invention includes Hysol 4329 commercially available from Hysol and Hysol 542-5 available from Hysol. Hysol 4329 has a glass transition temperature of 160° C., thermal expansion of 26 μm/m/°C., viscosity of 8,000 to 10,000 centipoise at 25° C., 67% by weight of filler having an alpha activity of 0.02 counts/hr/cm$^2$; and Shore D hardness of 95. Hysol 542-5 has a glass transition temperature of 156° C., thermal expansion of 25 μm/m/°C., viscosity of 7,000 to 11,000 centipoise at 25° C., 60–65% by weight of filler having an alpha activity of 0.005 counts/hr/cm$^2$, and Shore D hardness of 95. Although the encapsulant viscosity at 25° C. may be as high as 30,000 centipoise, the encapsulant and/or substrate may be treated from about 40° to about 90° C. to aid flow of the encapsulant under the chip.

Hysol 4329 according to the manufacturer contains as the polymeric portion about 15–35% by weight of methyl hexahydrophthalic anhydride and about 1 to about 15% by weight of cycloaliphatic epoxy, and Hysol 542-5 about 10 to about 30% by weight of methyl hexahydrophthalic anhydride and about 5 to about 20% by weight of cycloaliphatic epoxy.

Especially suitable encapsulants are those disclosed in U.S. patent application Ser. No. 07/493,126, filed Mar. 14, 1990, entitled Solder Interconnection Structure and Process for Making (Docket EN989-036) to F. Christie, K. Papathomas, and D. Wang and assigned to the assignee of the present application, disclosure of which is incorporated herein by reference.

Such encapsulants employ as the binder a cycloaliphatic polyepoxide, cyanate ester, prepolymer of cyanate ester or mixtures thereof.

The cycloaliphatic epoxides are known and can be obtained by oxidation of cyclic olefins. Examples of cycloaliphatic epoxides are suggested in U.S. Pat. Nos. 3,027,357; 2,890,194; 2,890,197; and 4,294,746, disclosures of which are incorporated herein by reference. Some specific examples of suitable cycloaliphatic epoxides are: 3,4-epoxycyclohexylmethyl- 3,4-epoxycyclohexane carboxylate, available from Union Carbide under the trade designation ERL-4221; bis (3,4-epoxycyclohexyl) adipate ERL-4299; and vinyl cyclohexane diepoxide, available from Union Carbide under the trade designation ERL-4206.

A discussion of various cycloaliphatic epoxides can be found in the publication entitled "Cycloaliphatic Epoxide Systems", Union Carbide, 1970, disclosure of which is incorporated herein by reference.

Mixtures of cycloaliphatic epoxides can be employed when desired. The preferred cycloaliphatic epoxide employed pursuant to the present invention is 3,4-epoxycyclohexylmethyl 3,4-epoxycyclohexanecarboxylate (systematic name: 7-oxabicyclo[4.1.0]heptane-3-carboxylic acid 7-oxabicyclo[4.1.0]hept-3-ylmethyl ester).

The cycloaliphatic epoxides and cyanate esters have a viscosity at 25° C. of no greater than about 1,000 centipoise, preferably about 300 to about 600 centipoise and most preferably about 300 to about 450 centipoise.

The cyanate esters have two or more —O—C≡N groups and are curable through cyclotrimerization.

The cyanate esters can be monomeric or less desirably polymeric, including oligomers and can be represented by those materials containing the following group:

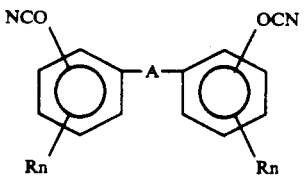

wherein A represents independently a single bond,

—SO$_2$—, —O—, —C(CF$_3$)$_2$—, divalent alkylene radicals such as —CH$_2$— and —C(CH$_3$)$_2$; divalent alkylene radicals interrupted by heteroatoms in the chain such as O, S, and N.

Each R is independently selected from the group of hydrogen, alkyl containing 1 to 9 carbon atoms:

Each n independently is an integer of 0 to 4.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference.

An example of a suitable polyaromatic cyanate ester containing cycloaliphatic bridging group between aromatic rings is available from Dow Chemical Company under the designation "Dow XU-71787.OOL cyanate. A discussion of such can be found in Bogan, et al., "Unique Polyaromatic Cyanate Ester for Low Dielectric Printed Circuit Boards", Sampe Journal, Vol. 24, No. 6, Nov/Dec 1988. A specific polyfunctional cyanate ester is Bisphenol AD dicyanate (4,4'-ethylidene bisphenol dicyanate) available from Hi-Tek Polymers under the trade designation AROCY L-10.

In the compositions that employ a cycloaliphatic epoxide, it is preferred to also employ small amounts of a reactive modifier. The purpose of the reactive modifier is to impart desirable mechanical properties to the cured composition such as flexibility and thermal shock resistance. Examples of modifiers which can be used are fatty acids, fatty acid anhydrides such as polyazelaic polyanhydride and dodecenylsuccinic anhydride, diols such as ethylene glycol, polyols, polyetherdiols such as polyethylene glycol and polypropylene glycol, and other materials having hydroxyl, carboxyl, epoxy, and/or carboxylic anhydride functionality. An especially suitable modifier is ethylene glycol which when employed is present in amounts of about 0.7 to about 2 phr (per hundred parts by weight of the epoxy).

Ethylene glycol is employed as a source of hydroxyls to promote the reaction of anhydride with the epoxy.

The organic substrates employed pursuant to the present invention include thermoplastic and thermosetting resins. Typical thermosetting resinous materials include epoxy, phenolic-based materials, polyimides and polyamides. Such materials are usually molded of the resinous material along with a reinforcing agent such as being a glass-filled epoxy or phenolic-based material. Examples of some phenolic-type materials include copolymers of phenol, resorcinol, and cresol. Examples of some suitable thermoplastic polymeric materials include fluorinated polymeric materials, polyolefins such as polypropylene, polysulfones, polycarbonates, nitrile rubbers, and ABS polymers.

Selection of a particular organic resin will depend in part on the processing temperatures that the substrate will be subjected to during the soldering.

The fluorinated polymeric materials employed pursuant to the present invention are well-known and include such commercially available polyfluoroalkylene materials as polytetrafluoroethylene, copolymers of tetrafluoroethylene and hexafluoropropylene, copolymers of tetrafluoroethylene and perfluoro-2-2 dimethyl-1,3 dioxide, polytrifluorochloroethylene, copolymers of tetrafluoroethylene with for example olefins such as ethylene; copolymers of trifluoromonochloroethylene with for example olefins such as ethylene, polymers of perfluoroalkyl vinyl ether.

Some commercially available fluorinated polymeric materials employed pursuant to the present invention include those available under the trade designation TEFLON PTFE (polymers of tetrafluoroethylene), TEFLON FEP (perfluorinated ethylene-propylene copolymers); TEFLON PFA (copolymer of tetrafluoroethylene and perfluoroalkoxy); TEFZEL (copolymer of tetrafluoroethylene and ethylene); HALAR (copolymer of chlorotrifluoroethylene and ethylene); KEL-F (polymer of chlorotrifluoroethylene); HBF-430 (polymer of chlorotrifluoroethylene) and TEFLON AF (copolymer of tetrafluoroethylene and at least 65 mole % of perfluoro-2,2-dimethyl-1,3 dioxide). The preferred fluorinated polymeric material is polytetrafluoroethylene (e.g. TEFLON).

Commercially available fluorocarbon polymers reinforced with fiber glass are available from Rogers Corporation under the trade designation R02800 and R02500.

The polyimides that can be used as substrates in accordance with the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

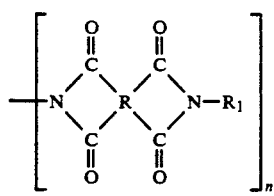

where n is an integer representing the number of repeating units to provide a molecular weight usually about 10,000 to 100,000. R is at least one tetravelent organic radical selected from the group consisting of:

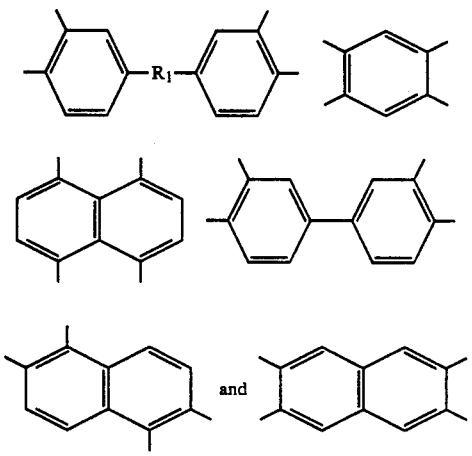

and $R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

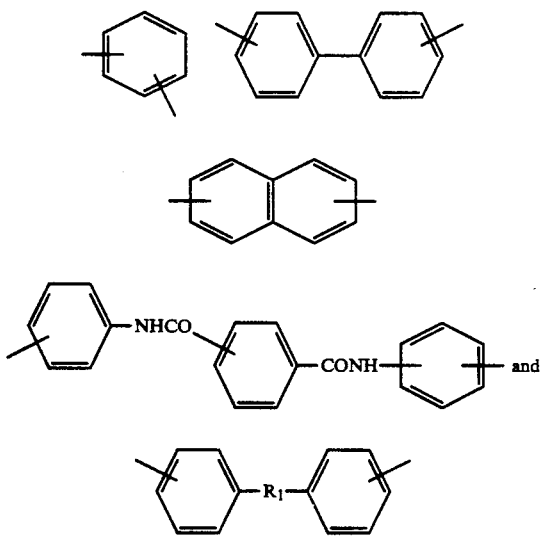

and in Which $R_3$ is a divalent organic radical selected from the group consisting of $R_2$, silicon, and amino radicals. Polymers containing two or more of the R and/or $R_1$ radicals, especially multiple series of $R_1$ containing amido radicals, can be used.

Commercially available polyimide precursors (polyamic acid) are various polyimide precursors from DuPont and available under the trade designation Pyralin. These polyimide precursors come in many grades, including those available Pyralin polyimide precursors from DuPont under the further trade designations PI-2555, PI-2545, PI-2560, PI-5878, PIH-61454, and PI-2540. Some of these are Pyromelletic Dianhydride-Oxydianiline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with an anhydride curing agent such as acetic anhydride. Also, commercially available are Upilex polyimides from Ube Industries.

Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane and alicyclic epoxy resins such as bis(3,4-epoxy-6-methyl-cyclohexyl methyl) adipate. The most preferred epoxy employed is of the bisphenol A type.

The epoxy resinous compositions also can contain accelerating agents and curing agents as well-known in the art. Examples of suitable curing agents include polyamines, primary, secondary, and tertiary amines, polyamides, polysulfides, urea-phenol-formaldehyde, and acids or anhydrides thereof. In addition, suitable curing agents include Lewis acid catalysts such as $BF_3$ and complexes thereof.

Many of the organic substrates employed in accordance with the present invention contain the resin and a reinforcing fiber such as fiberglass. Such compositions containing fibers are usually prepared by impregnating the fibers with, for instance, a composition of the polymer. The amount of the polymer composition is usually about 30% to about 70% by weight and preferably about 50% to about 65% by weight of the total solids content of the polymer composition in the fiberglass.

In the case of epoxy compositions such can be prepared by combining with the reinforcing fibers, and then curing to the B-stage and cutting to the desired shape such as a sheet. When sheets are employed, the thickness is usually about 1.5 mils to about 8 mils. The curing to the B-stage is generally achieved by using temperatures of about 80° C. to about 110° C. for about 3 minutes to about 10 minutes.

If desired, the substrate can then be laminated onto other substrates as well as being interposed between the above electrically conductive patterns present in the support layers.

The laminating can be carried out by pressing together the desired structure in a preheated laminating press at a predetermined pressure and temperature as, for example, about 200 psi to about 500 psi and preferably about 250 psi to about 300 psi at about 180° C. The time of the pressing operation is variable depending upon the particular materials employed and the pressure applied. About 1 hour is adequate for the above conditions.

The organic substrates include the desired electrically conductive circuitry on the top and/or bottom surfaces of the substrate and/or on interior planes of the substrate as well known.

Next, in order to connect the electrically conductive patterns on opposing surfaces of the dielectric material, through-holes in the structure can be made. The through-holes can be obtained by drilling or punching operations including mechanical drilling and laser drilling and subsequently plated.

The organic substrates are generally about 3 to about 300 mils thick and more usually about 40 to about 100 mils thick.

Disperse and flow conditions are preferably selected such that the composition forms fillets on all four sidewalls of the chip.

The polymer encapsulation material can be applied by dispensing through nozzles under pressure of about 15 to about 90 psi and temperatures of about 25° to about 90° C. The compositions completely cover the C4 connections.

If desired, the flow of the compositions under the chip can be accelerated by heating for about 2 to about 20 minutes, typically about 15 minutes at about 40° to about 90° C.

Also, if desired, the compositions can be pregelled by heating for about 6 to about 60 minutes typically about to about 15 minutes at about 110° C. to about 130° C. and preferably about 6 to about 10 minutes at about 115° C. to about 120° C.

The compositions are then cured by heating to about 130° to about 150° C. and preferably about 130° to about 140° C. for about 2 to about 6 and preferably about 4 to about 5 hours.

The following non-limiting examples are presented to further illustrate the present invention.

EXAMPLE 1

A silicon chip is soldered by solder bumps of 95 Pb/5 Sn alloy to a glass fiber reinforced teflon substrate of about 60 mils thick (RO 2800 from Rogers) have copper/Invar/copper inside the substrate and copper circuitry on the top surface thereof. Hysol 4329 is dispensed at a temperature of about 90° C. in the gap of about 3 mils between the silicon chip and the substrate. The composition is cured at about 130° C. in about 6 hours. The cured composition has a coefficient of thermal expansion of less than $30 \times 10^{-6}/°C$. The composition covers the solder bumps.

The structures are tested for fatigue life exhibiting its first failure when thermocycling the parts for over 9,000 cycles between 0° C. to 100° C. On the other hand, control parts not filled with an encapsulating composition show failures between 455-1472 cycles.

EXAMPLE 2

Example 1 is repeated except that the substrate is cyanate resin of about 60 mils thick containing 1 oz. copper foil inside the substrate and copper circuitry on the top surface thereof.

The structures are tested for fatigue life exhibiting its first failure at about 6621 cycles between 0° C. to 100° C. On the other hand, central parts not filled with an encapsulating composition shows failures at less than 162 cycles.

EXAMPLE 3

Parts prepared pursuant to Example 1 are also exposed to cycles of 3 minutes each in liquid nitrogen in addition to the 9,000 thermal cycles of 0° C. to 100° C. without producing any failures.

What is claimed is:

1. A method of providing solder interconnections between a semiconductor device and a supporting organic substrate comprising attaching said device to said organic substrate by a plurality of solder connections that extend from the supporting substrate to electrodes on said semiconductor device to form a gap between said supporting substrate and said semiconductor device;

filling said gap with a composition that contains:
   A. a curable thermosetting binder said binder having a viscosity at room temperature of no greater than about 1,000 centipoise;
   B. filler having a maximum particle size of 50 microns wherein the amount of A is about 60 to about 25 percent by weight of the total of A and B, and correspondingly the amount of B is about 40 to about 75 percent by weight based upon the amount of A and B; and curing said composition.

2. The method of claim 1 wherein said gap is about 2 to about 6.0 mils wide.

3. The method of claim 1 wherein said filler is an inorganic filler selected from the group of silica, quartz and fused silica, optionally treated with coupling agents.

4. The method of claim 1 wherein said filler has emission rate of less than 0.01 alpha particles/cm²-hr.

5. The method of claim 1 wherein said filler has particle sizes of about 0.5 to about 20 micrometers.

6. The method of claim 1 wherein the viscosity at 25° C. of said composition is about 3,000 to about 30,000 centipoise.

7. The method of claim 1 wherein said substrate includes copper foil as the metal in interior planes thereof.

* * * * *